(12) United States Patent
Daamen et al.

(10) Patent No.: US 8,367,552 B2
(45) Date of Patent: Feb. 5, 2013

(54) METHOD FOR FABRICATION OF IN-LAID METAL INTERCONNECTS

(75) Inventors: Roel Daamen, Leuven (BE); Viet Nguyen Hoang, Leuven (BE); Romano Julma Oscar Maria Hoofman, Leuven (BE); Greja Johanna Adriana Maria Verheijden, Leuven (BE)

(73) Assignee: NXP B.V., Eindhoven (NL)

( * ) Notice: Subject to any disclaimer, the term of this patent is extended or adjusted under 35 U.S.C. 154(b) by 1582 days.

(21) Appl. No.: 10/526,422

(22) PCT Filed: Aug. 4, 2003

(86) PCT No.: PCT/IB03/03440
§ 371 (c)(1),
(2), (4) Date: Jul. 5, 2006

(87) PCT Pub. No.: WO2004/023550
PCT Pub. Date: Mar. 18, 2004

(65) Prior Publication Data
US 2011/0097896 A1    Apr. 28, 2011

(30) Foreign Application Priority Data
Sep. 4, 2002    (EP) .................................... 02078620

(51) Int. Cl.
*H01L 21/302* (2006.01)
*H01L 21/461* (2006.01)

(52) U.S. Cl. .................................. 438/692; 257/E21.23

(58) Field of Classification Search .................... 438/692
See application file for complete search history.

(56) References Cited

U.S. PATENT DOCUMENTS

| | | | |
|---|---|---|---|
| 5,578,523 A | 11/1996 | Fiordalice et al. | |
| 6,150,260 A | 11/2000 | Roy | |
| 6,160,314 A | 12/2000 | Chao | |
| 6,274,485 B1 | 8/2001 | Chen et al. | |
| 6,294,457 B1 | 9/2001 | Liu | |
| 6,348,395 B1 | 2/2002 | Stephens et al. | |
| 6,376,376 B1 | 4/2002 | Lim et al. | |
| 6,713,402 B2 * | 3/2004 | Smith et al. .................... | 438/710 |

FOREIGN PATENT DOCUMENTS

| | | |
|---|---|---|
| EP | 1 249 866 | 10/2002 |
| JP | 2001044201 A | 2/2001 |

* cited by examiner

*Primary Examiner* — William D Coleman

(57) ABSTRACT

The present invention relates to a method for fabrication of in-laid metal interconnects. The method comprises the steps of providing a substrate with a dielectric material on top thereof, depositing a protection layer on top of the dielectric material, depositing a sacrificial layer on top of the protection layer, the sacrificial layer having a mechanical strength that is lower than the mechanical strength of the protection layer, making an opening) through the sacrificial layer, through the protection layer and into the dielectric material, depositing a barrier layer in the opening and on the sacrificial layer, depositing metal material on the barrier layer, the metal material filling the opening, removing portions of the metal material existing beyond the opening by means of polishing, and removing the barrier layer and the sacrificial layer in one polishing step.

10 Claims, 2 Drawing Sheets

METHOD FOR FABRICATION OF IN-LAID METAL INTERCONNECTS

The present invention relates to semiconductor device or integrated circuit manufacturing methods, and more specifically to methods for forming in-laid metal interconnects as well as to methods for manufacturing semiconductor devices or integrated circuits having such in-laid metal interconnects.

In integrated circuits, copper has many benefits when compared with aluminium: it has better conductance (lower resistance), which means lines can be smaller and packed more tightly, yet still can carry the same current. This translates into fewer levels of metal required and thus in lower production costs. Lower resistance also leads to faster speed. Also, copper has better resistance to electromigration (this is the mass transport of metal ions in metal lines, potentially thinning and thus inhibiting conduction paths, or leading to a short between adjacent connectors), leading to improved reliability. Perhaps best of all, copper is said to provide better yield than aluminium-based devices of the same design.

Over the past few years, many semiconductor companies have taken advantage of these benefits, and copper is now in volume production at facilities around the world.

The move to copper, however, has not been without its challenges. The biggest change has been that, because copper is difficult to etch, an alternative patterning methodology, called damascene, is required. This is a process in which interconnect metal lines are delineated in dielectrics isolating them from each other, not by means of lithography and etching but by means of chemical-mechanical planarisation (CMP). In this process the interconnect pattern is first lithographically defined in the layer of dielectric, then metal is deposited to fill resulting trenches and then excess metal is removed by means of CMP (planarisation).

Figure 1:
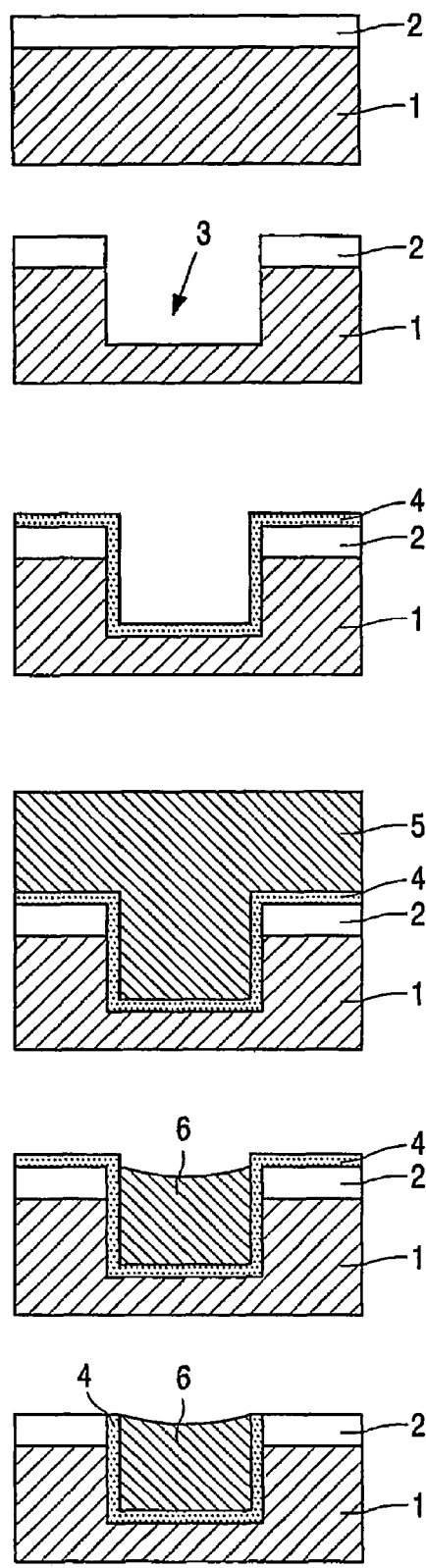

The prior art method to make in-laid copper interconnects is represented in FIG. 1. The method starts from a dielectric or a dielectric stack 1, such as silicon dioxide for example, on a substrate (not represented). On top of the dielectric layer or dielectric stack (several superimposed layers) 1, a protection layer 2 or a plurality of protection layers of different materials, such as e.g. a double hard-mask $SiO_2/SiC$ or $SiO_2/Si_3N_4$, is deposited. Trenches 3 and vias (inter-layer connection locations—not represented in the drawing) are created through the protection layer 2 in the dielectric 1 before barrier, copper are applied. Vias are patterned as open holes that expose an underlying metal layer (not represented) at the bottom of certain trenches 3.

After the trenches 3 and vias are formed, a diffusion barrier layer 4 is deposited, typically by physical vapor deposition (PVD), to the entire wafer surface. The barrier layer 4 covers not only the topside of the wafer, but also the sides and bottom of the trenches 3 and the vias. In addition to being very good at blocking the diffusion of copper, the barrier layer 4 must have excellent adhesion to the dielectric 1 and to the copper. Good adhesion is necessary to resist delamination during further processing or thermal stressing, and for electromigration resistance. The barrier layer 4 is often deposited as a bilayer, of which one layer, e.g. TaN, adheres very well to $SiO_2$ and of which one layer, e.g. Ta, adheres very well to copper.

Once the barrier layer 4 covers the entire wafer, copper 5 is deposited on top thereof to the desired thickness.

The wafer then undergoes CMP. The CMP step eliminates in a first step all copper and in a second step the barrier material, except for the copper and barrier material within the trenched locations 3. A multi-step process is thus needed, with separate process steps for copper removal and barrier material removal, because the barrier materials are relatively chemically stable and hard to remove. This multi-step process is time-consuming and expensive as different types of (usually expensive) consumables are required for barrier removal.

Furthermore, for high performance microelectronics, it is desirable to use low-k dielectrics (i.e. dielectric materials with a dielectric constant k below 4.2) for the dielectric stack 1. However, when low-k materials are used for the dielectric stack 1, the dielectric layers tend to delaminate when CMP is being carried out. A thick protection layer 2 is needed to protect low-k material 1, which increases the overall dielectric constant of the dielectric layers.

The result of the above process is that patterned islands 6 of copper embedded within the insulator trenches 3 are generated. One of the biggest challenges in copper CMP is the balance between under-polish, which leaves copper residues and leads to shorting, and over-polish, which erodes and generates dish features, and which leads to a poor planarity of the wafer's surface. Dishing occurs due to polishing rate differences between copper 5 and the protection layer 2, when the polishing pad under the pressure of polishing, is able to deform into the damascene structure and polish it below the field area. The amount of dishing that occurs is related to the polishing pad characteristics, the size of the structure, and the polishing parameters (speed, pressure, temperature). Copper 5 is much softer than the protection layer 2 and polishes much faster. This complicates the process of producing multi-level interconnect structures.

A solution to the dishing problem is proposed in JP-200144201, which describes a damascene structure and its manufacture. Use is made of a sacrificial layer that is a modified top part of the dielectric layer and is present under the barrier layer. There is no protection layer or hard mask present in the stack (having a hard mask is sometimes a must in dual damascene patterning and for low-k materials; however, presence of a hard mask is not desirable as it increases the dielectric constant of the whole dielectric stack). Excess copper is removed during a first CMP step, which already generates copper dishing. The barrier layer is removed during a second CMP step. While removing the barrier layer, copper is further dished. After removing the barrier layer, the sacrificial film is removed with a higher speed (up to 100 times as large) than the copper. Therefore, dishing of the copper is reduced with respect to other prior art methods. However, a time-consuming and expensive multiple-step CMP process is required to get the desired result.

It is an object of the present invention to overcome the above disadvantages.

More particularly, it is an object of the present invention to provide a method for fabrication of in-laid metal interconnects, which saves time and cuts costs.

The above objectives are accomplished by a method according to the present invention, in which the need for multiple consumables is reduced by eliminating a separate barrier removal step.

A method for fabrication of in-laid metal structures according to the present invention comprises the steps of:

Providing a substrate with a dielectric material on top thereof. According to an embodiment of the present invention, the dielectric material may comprise a low-k material.

Depositing a protection layer on top of the dielectric material.

Depositing a sacrificial layer on top of the protection layer, the sacrificial layer having a mechanical strength that is lower than the mechanical strength of the protection layer. The sacrificial layer preferably is a low-k material, although some high k materials can also be used with the present invention.

Making an opening through the sacrificial layer, through the protection layer and into the dielectric material. This step of making an opening may for example comprise an etching step.

Depositing a barrier layer in the opening and on the sacrificial layer. Preferably for all metal materials a liner layer is provided for adhesion promotion and filling enhancement. For the present invention this liner layer is considered to be equivalent to a barrier layer.

Depositing metal material on the barrier layer, the metal material filling the opening. The metal material may for example be, but is not limited to, copper, aluminium, silver, gold, or tungsten. The step of depositing metal material may comprise e.g. depositing metal material by chemical vapor deposition.

Removing portions of the metal material existing beyond the opening by means of polishing.

Removing the barrier layer and the sacrificial layer in one polishing step. This one polishing step may make use of one consumable set.

The use of a sacrificial layer makes it easier to remove the barrier layer, especially when the barrier layer has a high mechanical strength such as e.g. Ta/TaN, and thereby reduces dishing.

According to an embodiment of the invention, the portions of the metal material existing beyond the opening, the barrier layer and the sacrificial layer may be removed in one polishing step. The one polishing step may make use of one consumable set.

Polishing steps may be steps of chemical mechanical polishing (CMP).

The method may furthermore comprise a buffing step for at least partially removing the protection layer.

The barrier layer may be removed by removing the sacrificial layer from the underlying protection layer. This may be done by peeling off or by lifting off the sacrificial layer from the underlying protection layer. In a method according to the present invention, the sacrificial layer may be formed of a material that can be peeled off or lifted off from the underlying protection layer during polishing when friction between the wafer and polishing means exceeds a threshold value.

According to a preferred embodiment, the adhesion between the sacrificial layer and the protection layer is weaker than the adhesion between the protection layer and the dielectric material. It is advantageous if the adhesion between sacrificial layer and protection layer is the weakest one in the whole stack.

The present invention also provides a method for manufacturing a semiconductor device using a method for fabrication of in-laid metal structures according to the present invention.

The above and other features and advantages of the present invention will become apparent from the following detailed description of a specific embodiment of the method according to the present invention, taken in conjunction with the accompanying drawings, which illustrate, by way of example, the principles of the invention. This description is given for the sake of example only, without limiting the scope of the invention. The reference figures quoted below refer to the attached drawings.

FIG. 1 gives an overview of the different process steps carried out to manufacture copper interconnects according to the prior art.

Figure 2:
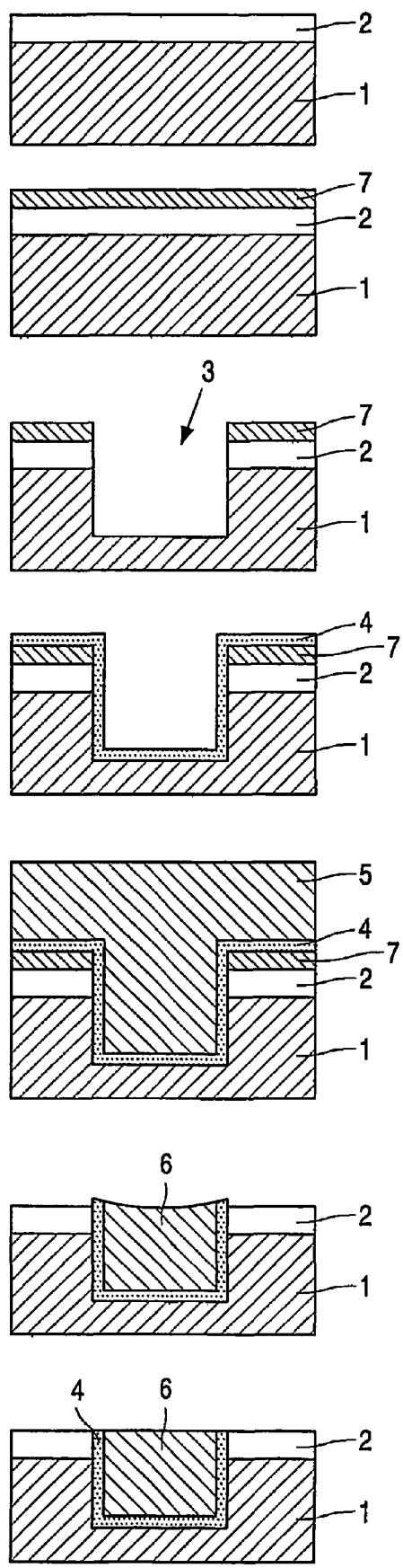

FIG. 2 gives an overview of the different process steps carried out to manufacture metal interconnects according to an embodiment of the present invention.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. In particular some of the layers may not be drawn on scale. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The method according to the present invention to make in-laid metal interconnects, for example copper interconnects, is represented in FIG. 2.

A semiconductor device made according to the present invention includes a semiconductor substrate (not represented in the drawings) having a conductive member (not represented in the drawings) and an overlying dielectric layer or dielectric stack 1. In semiconductor devices such as integrated circuits, the substrate will generally be a single crystal silicon wafer. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), a germanium (Ge), or a silicon germanium (SiGe) substrate. The "substrate" may include, for example, an insulating layer such as a $SiO_2$ or an $Si_3N_4$ layer in addition to a semiconductor substrate portion. Thus, the term substrate also includes silicon-on-insulator (SOI), silicon-on-glass, silicon-on sapphire (SOS) substrates. The term "substrate" is thus used to define generally the elements for layers that underlie a layer or portions of interest. Also, the "substrate" may be any other base on which a layer is formed, for example a glass or metal layer. In the following, processing will mainly be described with reference to silicon processing but the skilled person will appreciate that the present invention may be implemented based on other semiconductor material systems. The skilled person can select suitable materials as equivalents of the dielectric and conductive materials described below.

The conductive member (not represented) may be a metal interconnect. However, any conductive member of a semiconductor device is suitable, including polysilicon members, silicide regions, refractory metals, or even a diffused region. The conductive member is not required in practicing the present invention, but in most instances an inlaid interconnect will at some point in the device have an electrical connection to an underlying conductive member.

On top of the substrate and the conductive member, a dielectric layer or a dielectric stack 1 is provided. The dielectric layer 1 is generally, in a silicon-based system, a silicon dioxide based material, such as phospho-silicate-glass (PSG), boron doped PSG (BPSG), thermal oxide, tetra-ethyl-ortho-silicate (TEOS), spin-on-glass (SOG) or CVD oxide, but may be any other suitable type of dielectric. The dielectric or dielectric stack 1 may be a dielectric layer or stack of layers of low-k material (k-value below 4.2). For high performance microelectronics, the lowest delay interconnect system will require both a low resistivity conductor (such as copper for example) and a low-k dielectric. Xerogel is one possibility of a low-k material; it is composed of a highly porous network of $SiO_2$. It can be produced with a wide range of dielectric constants by tuning the porosity during the deposition process; a dielectric constant between 1.3 and 3.0 may be obtained. The porosity also controls the mechanical properties of the xerogel, and can be optimized for damascene processing according to the present invention. Alternatively, a composite xerogel/oxide dielectric stack may be used. Another possibility for a low-k material is an organic polymer such as SiLK, which can be obtained from Dow Chemical Co. and has a k-value of 2.6, or porous SiLK, which has a k-value of 2.0. Low-k materials may have an adhesion promotor layer underneath. The dielectric layer or stack of layers 1 may have, for example, a thickness between 330 and 400 nm.

On top of the dielectric layer or stack 1, a protection layer 2 is deposited. The protection layer 2 may be formed from silicon dioxide ($SiO_2$), silicon nitride ($Si_3N_4$), silicon carbide (SiC), or any other suitable material. The protection layer 2 helps in defining damascene structures (etching of the hard mask) and protects the underlying (low-k) material when later on in the process CMP is carried out. The protection layer 2 may for example have a thickness of about 30 nm.

On top of the protection layer 2, a sacrificial layer 7 is provided. Materials that can be used for the sacrificial layer 7 are in general siliconoxide based and/or organic materials with a low or poor adhesion to the underlying protection layer 2. The sacrificial layer 7 is preferably a thin layer, e.g. between 20 to 50 nm, of material that can easily be peeled off from underlying protection layer 2 during CMP when the friction between the wafer and the polishing pad exceeds a threshold value (hereafter referred to as "delaminating material"), such as e.g. SiLK without adhesion promotor. The sacrificial material may be a low-k material, or a delaminating material with a higher k. The adhesion is preferably such that it is sufficiently low to cause peeling off later on during the process, but not so poor that it causes unstable growth of subsequent layers. The sacrificial layer 7 is deposited in a way such that its adhesion to the protection layer 2 is smaller than or equal to that of the protection layer 2 to the underlying dielectric layer 1 (which may also be a low-k dielectric layer). The sacrificial layer 7 preferably has a mechanical strength weaker than both the protection layer 2 and the barrier layer 4. The sacrificial layer 7 may for example have a thickness of about 100 to 135 nm.

Then conventional lithographic patterning steps are carried out, and openings 3, vias and trenches are created through the sacrificial layer 7 and the protection layer 2 in the dielectric 1, for example by means of conventional reactive ion etching (RIE) techniques.

After the openings 3, vias and trenches are formed, a diffusion barrier layer 4 is deposited, typically by PVD, to the entire wafer surface. The barrier layer 4 covers not only the topside of the wafer, but also the sides and bottom of the openings 3, vias and trenches. The diffusion barrier layer 4 prevents the interconnect metal 5 from penetrating into the dielectric layer 1 and the underlying silicon substrate. In addition to being very good at blocking the diffusion of interconnect metal 5, the barrier layer 4 preferably has excellent adhesion to the dielectric 1 and to the interconnect metal 5. Good adhesion is necessary to resist delamination during further processing or thermal stressing, and for electromigration resistance.

The barrier layer 4 may be deposited as a bilayer. For example, TaN adheres very well to $SiO_2$ and most low-k dielectrics. Ta adheres well to copper. For this reason, the barrier layer 4 may be deposited as a bilayer, with TaN at the dielectric interface, and Ta at the copper interface. A variety of other materials may also be used to form a bilayer, including e.g. Ti/TiN, TaSiN and $WN_x$.

Once the barrier layer 4 evenly covers the entire wafer, an interconnect metal layer 5, e.g. copper, is deposited to the desired thickness. Interconnect metal 5 is deposited such that it fills openings 3, vias and trenches, being, at certain locations, in electrical and physical contact with underlying conductive members. Because deposition of the interconnect metal 5 is not selective to deposition within the openings 3, vias and trenches alone, the interconnect metal 5 will likewise deposit on top of the barrier layer 4 around the openings 3, vias and trenches. Interconnect metal 5 may be deposited in a variety of ways, including electroplating, sputter deposition, hot deposition, or CVD.

In order to establish proper electrical isolation of the interconnects 6, excessive interconnect metal 5 must be removed. According to the present invention, this is accomplished using a mechanical polishing technique, e.g. CMP. Portions of interconnect metal 5 beyond openings 3, vias and trenches, and originally overlying the barrier layer 4 are removed from the device.

When the barrier layer 4 is reached during the CMP process, there is a considerable increase in friction force between the wafer and the polishing pad as compared to the friction force between the wafer and the pad when interconnect metal 5 was still present on the wafer surface. The mechanical stress induced by the CMP step removes the barrier layer 4 in the same step with interconnect metal 5 removal by breaking off the bonds between the sacrificial layer 7 and the protection layer 2.

Furthermore, due to the weaker mechanical strength of the sacrificial layer 7 with respect to the other layers, the sacrificial layer 7 has a higher removal rate compared to interconnect metal 5, barrier layer 4 and underlying protection layer 2. This fact also helps to minimize dishing of the metal line 6 which is a technical challenge of e.g. copper CMP.

The effect of changing friction force is used in the process of the present invention, such that the sacrificial layer 7 is not removed while there is still metal 5 present on top, because this would lead to formation of cracks. The friction force between the wafer and the polishing pad can be controlled by means of chemical and/or mechanical means. By adding some additives such as surfactants into the polishing solution/slurry at the moment the barrier material is reached, the friction force between the wafer and the polishing pad can be increased as known by a person skilled in the art. Changing the polishing pressure and/or polishing speed is yet another way of controlling the friction forces. An aspect of the present invention is to have a mechanical polishing process such as a CMP process where friction is kept below a threshold value, at and beyond which delamination of sacrificial layer 7 can occur, when metal 5 is being planarised/polished, and then to increase the force to a required level (equal or larger than the threshold value for delamination of sacrificial layer 7) when the barrier layer 4 is reached.

At the moment of transition from the metal layer 5 to the barrier layer 4, the friction force will change: the friction increases or decreases depending on the barrier material and the chemistries of the used slurry. Reaching barrier layer 4 may be detected by any suitable means. One possibility is to optically detect the endpoint. This can be done by an optical, e.g. laser based method which detects a difference in reflectivity when transitioning from metal 5 to barrier layer 4. Another method to detect the transition from metal layer 5 to barrier layer 4 is to monitor the currents which are driving the wafer carrier and the polishing table (also called platen). A wafer carrier and a platen are driven by two motors. The currents feeding these motors are regulated to ensure a constant rotary speed of both the wafer carrier and the platen. When friction force between the wafer and the polishing pad changes, the currents are changed to compensate for any slow down or acceleration of the wafer carrier and the platen. Thus by monitoring these motor currents, the friction can be monitored.

A friction control method is provided at the point when the barrier layer 4 is reached during CMP step. As soon as the barrier layer 4 is reached, an increase in friction is applied by means of chemical and/or mechanical means. This can be done in any suitable way. A chemical way is to apply a certain amount of surfactant to the slurry/polishing solution. A mechanical way is to raise the pressure and/or the speed of the CMP head and/or the belt or pad to increase the friction after detection of the endpoint. Another mechanical way is to lower the slurry feeding rate, or thus the amount of slurry on the pad.

Specific values of the friction force and threshold value for delamination have to be determined experimentally for each and every polishing condition set (including pad type, conditioning head type, slurry type, pressure, speed, slurry speed, barrier material type, etc.)

Due to removal of the sacrificial layer (by peeling off due to friction and by polishing), both the barrier layer 4 and the excess copper can thus be removed in one CMP step with one consumable set, which greatly reduces the process complexity and the cost with respect to prior art methods, and increases the process throughput.

The protection layer 2 acts as a stopping layer for the CMP process. As mechanical stress induced by the CMP step is released via breaking bonds between the sacrificial low-k material layer 7 and the protection layer 2, less stress is observed in the low-k dielectric material 1 under the protection layer 2. This greatly reduces the possibility that this layer 1 delaminates, erodes or becomes damaged due to stress in the CMP process. This has a positive effect on the yield of the overall process. Furthermore, the protection layer 2 used can be thinner than any protection layer used in the prior art, as the sacrificial low-k dielectric layer 7 plays a role as protection and lubricant layer of the protection layer 2. The thinning of the protection layer 2 is of importance for lowering the effective k value of the whole dielectric stack.

Patterned islands 6 of interconnect metal 5 embedded within the insulator openings 3, vias and trenches are thus obtained. Dishing of the metal structure 6 is reduced in a controlled fashion. The interconnect has an exposed upper surface which is substantially planar within the opening and with the surrounding interlayer dielectric.

The protection layer 2 is then preferably removed, at least partially, because in advanced processes it is not desired that higher-k materials are present in the interconnect system. This can be done by a buffing step. Buffing is almost the same as normal polishing, but using a different slurry, a very soft pad (generally a so-called Politex pad from Rodel Inc.) and a very low pressure. This step may use, for example, a very low pressure and an oxide-slurry to touch up the surface of the wafer. A slurry with 1 to 1 selectivity toward copper and the protection layer 2 material may be used. In this way, both protection layer 2 and protruding copper features or structures (if any) are removed. A better planarity for the wafer surface is thus obtained. In this way a very small amount of material can be removed (scratch reduction). After the use of the oxide slurry, a rinse step is done on the same pad. This buffing step is not an extra step, as it is already common practice among CMP world.

If the protection layer is not completely removed, an acceptable remaining thickness is preferably as low as possible, preferably less than about 50 nm.

It is an advantage of the present invention, that the amount of process steps and the amount of consumables in CMP are reduced.

While the invention has been shown and described with reference to preferred embodiments, it will be understood by those skilled in the art that various changes or modifications in form and detail may be made without departing from the scope and spirit of this invention. In particular other suitable materials may be used, or the layers may have other thicknesses.

The invention claimed is:

1. A method for fabrication of in-laid metal structures, comprising the steps of:
   providing a substrate with a dielectric material having a dielectric constant less than 2.6 on top thereof,
   depositing a protection layer on top of the dielectric material,
   depositing a sacrificial layer on top of the protection layer, the sacrificial layer having a mechanical strength which is lower than the mechanical strength of the protection layer,
   making an opening through the sacrificial layer, through the protection layer and into the dielectric material,
   depositing a barrier layer in the opening and on the sacrificial layer
   depositing metal material on the barrier layer, the metal material filling the opening,
   removing portions of the metal material existing beyond the opening by means of polishing, and
   removing the sacrificial layer and portions of the barrier layer existing beyond the opening in one polishing step.

2. A method according to claim 1, wherein the portions of the metal material existing beyond the opening, the barrier layer and the sacrificial layer are removed in one polishing step.

3. A method according to claim 1, wherein the one polishing step makes use of one consumable set.

4. A method according to claim 1, wherein the polishing step is a step of chemical mechanical polishing (CMP).

5. A method according to claim 1, wherein the adhesion between the sacrificial layer and the protection layer is weaker than the adhesion between the protection layer and the dielectric material.

6. A method according to claim 1, wherein the sacrificial layer is a low-k material.

7. A method according to claim 1, wherein the dielectric material comprises a low-k material.

8. A method according to claim 1, wherein the step of depositing metal material comprises depositing copper, aluminum, silver, gold, or tungsten.

9. A method according to claim 1, wherein the step of depositing metal material comprises depositing metal material by chemical vapor deposition.

10. A method for manufacturing a semiconductor device using a method for fabrication of in-laid metal structures according to claim 1.

* * * * *